United States Patent [19]

Franco

[11] 4,116,510
[45] Sep. 26, 1978

[54] CHASSIS FORMED OF SHEET STOCK

[75] Inventor: Harold D. Franco, San Mateo, Calif.

[73] Assignee: GTE Automatic Electric Laboratories Incorporated, Northlake, Ill.

[21] Appl. No.: 773,984

[22] Filed: Mar. 3, 1977

[51] Int. Cl.² .................................................. A47B 43/00
[52] U.S. Cl. .............................. 312/257 SK; 312/263; 312/140; 220/4 R; 85/32 V
[58] Field of Search ................. 312/263, 257 SK, 140; 220/4 F, 4 R, 3.94; 85/32 V

[56] References Cited

U.S. PATENT DOCUMENTS

| Re. 24,133 | 3/1956 | Bloedow | 85/32 V |
|---|---|---|---|
| 609,356 | 8/1898 | Krantz | 220/3.94 |
| 2,356,934 | 8/1944 | Ketcham | 85/32 V |
| 2,535,682 | 12/1950 | Jones | 312/263 |
| 2,552,400 | 5/1951 | Brunia | 220/3.94 |
| 2,611,460 | 9/1952 | Nash | 220/4 F |
| 3,410,441 | 11/1968 | Rhyne | 312/263 |
| 3,488,697 | 1/1970 | Lewandowski et al. | 85/32 V |
| 3,721,746 | 3/1973 | Knappenberger | 220/4 R |
| 3,895,178 | 7/1975 | Huibrechtse | 220/3.94 |
| 3,944,310 | 3/1976 | Welsh | 312/263 |

Primary Examiner—Mervin Stein
Assistant Examiner—Victor N. Sakran
Attorney, Agent, or Firm—Leonard R. Cool; Russell A. Cannon

[57] ABSTRACT

This chassis has side, top, bottom and rear plates which are made out of sheet stock and where are oriented at 90° with respect to each other. Bifurcated tongues are formed in edges of plates. Elongated slots are also formed in plates at points spaced away from the edges thereof. The slots and tongues are dimensioned and oriented on the plates such that in an assembled shelf, the bifurcated tongues are located in associated slots so as to form square openings defined by walls of the associated slots and bifurcations-openings. Self-tapping screws threaded into the square openings and axially aligned bifurcations-openings cut threads in the walls defining these aligned openings over the full grip length of the screws to hold the plates together.

18 Claims, 7 Drawing Figures

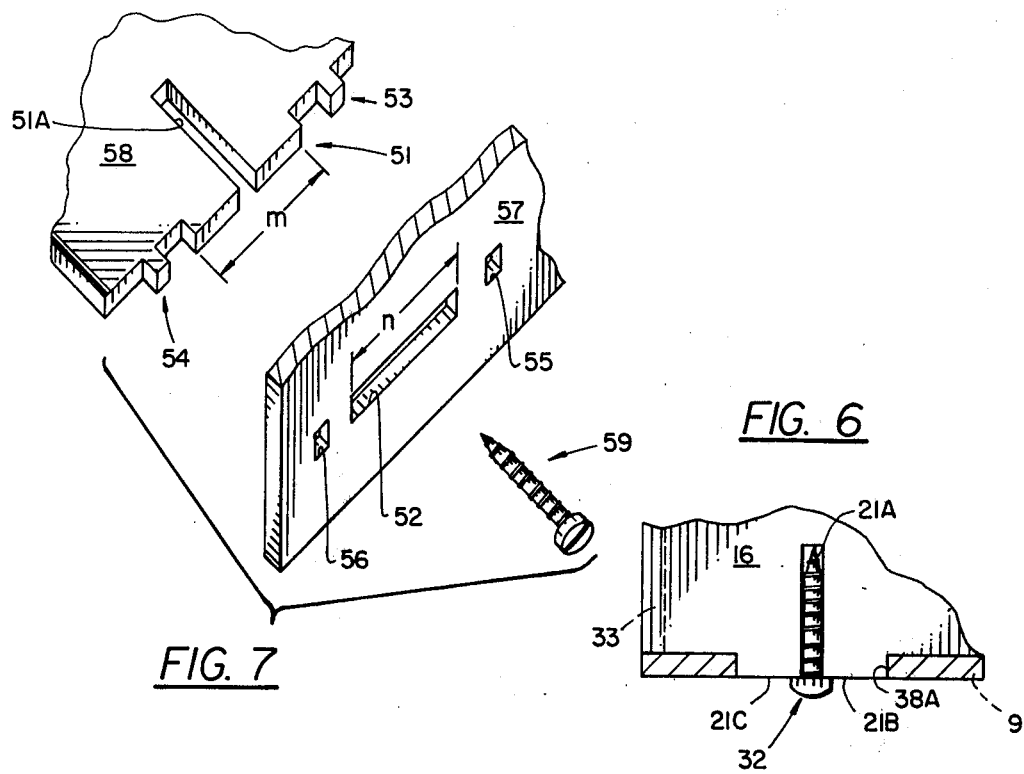
FIG. 6
FIG. 7
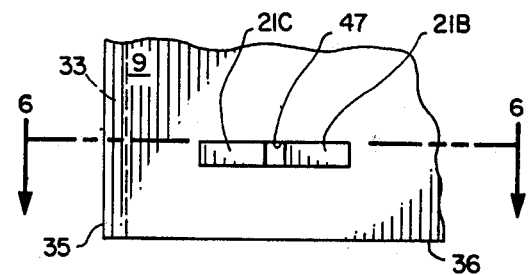
FIG. 5
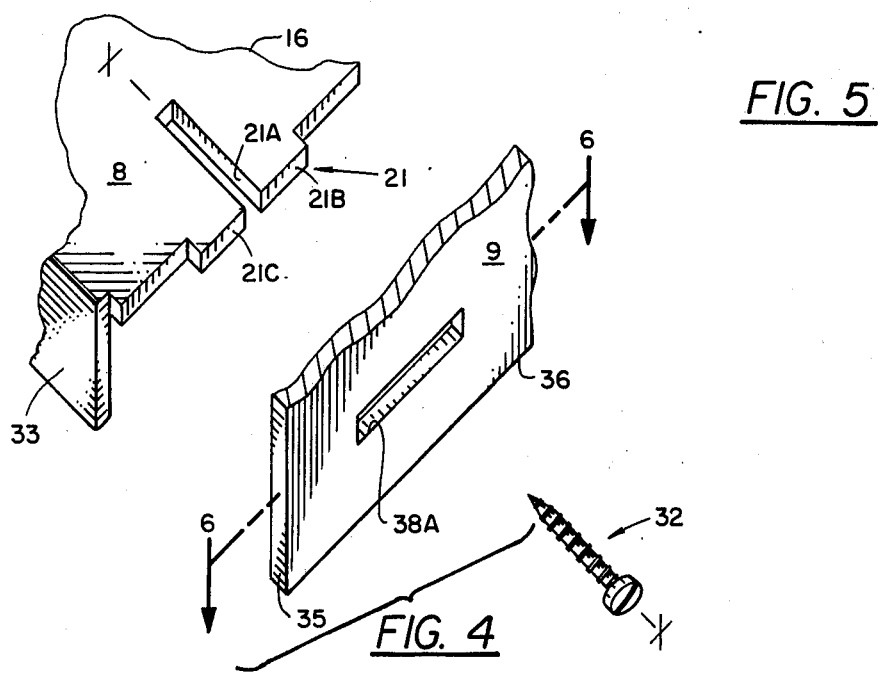
FIG. 4

CHASSIS FORMED OF SHEET STOCK

BACKGROUND OF THE INVENTION

This invention relates to a chassis for supporting other parts such as electrical equipment, and more particularly, to a chassis that can be made of sheet stock which is secured together by only screws.

Electrical equipment such as repeater units of telephone systems typically include a shelf-like chassis which supports a plurality of printed circuit (PC) cards and/or channel units. In a prior art cast aluminum shelf, the PC cards are supported between top and bottom cast parts which are supported horizontally between vertically oriented cast side parts. Elongated troughs and oversized holes are formed in the edges of the horizontal members and in the sides, respectively, to facilitate attaching these parts together. The troughs are many times longer than the diameter of selftapping screws that are passed through the holes in the sides without contacting the latter and threaded directly into the troughs to attach these parts together. Since there is nothing to guide or maintain alignment of the screws, they tend to take the path of least resistance and end up skewed in the cast troughs. Also, these cast parts are much thicker than sheet stock which means that they are relatively heavy and consume more storage space in a knocked down state than does sheet stock. Another prior art shelf for a similar application and which is made out of sheet metal requires that each of the side-edges of the horizontal top and bottom parts be bent over to form a lip. Holes are drilled through these lips and the sides for attaching these parts together with nuts and bolts. Alternatively, plug-nuts are pressed into the holes of the lips for receiving the bolts. In another prior art shelf, the sheet metal parts are spot-welded together. These prior art sheet metal shelves require welding and other handwork which are expensive. Also, they have multiple bends in them which makes it difficult to store these shelves in a knocked down state.

An object of this invention is the provision of an improved chassis-shelf and fastening technique therefor.

SUMMARY OF THE INVENTION

In accordance with this invention, a mating slot and bifurcated tongue are formed in the surface of and in the edge of associated ones of a pair of relatively flat parts which are to be joined together at substantially right angles. The tongue is dimensioned to fit securely in the slot, the width of the bifurcation-opening in the tongue being substantially equal to the thickness of the tongue and the slot. A self-tapping screw threaded into the bifurcation-opening located in the slot cuts threads in walls defining the slot and bifurcation-opening over the full grip length of the screw to securely hold the two flat parts together.

DESCRIPTION OF THE DRAWINGS

This invention will be more fully understood from the following detailed description of preferred embodiments thereof, together with the drawings in which:

FIG. 4 is an enlarged-exploded view of portions of the bottom 8 and side 9 which are aligned for engagement of the tongue 21 in the slot 38A;

FIG. 5 is an enlarged front view of the bifurcated tongue 21 in slot 38A, the walls of the bifurcation-opening 21A and slot 38A defining a square opening 47;

FIG. 6 is an enlarged section view taken along lines 6—6 in FIGS. 4 and 5 with the screw 32 threaded into the square opening 47 and the bifurcation-opening 21A; and FIG. 7 is a perspective view of an alternate embodiment of this invention.

DESCRIPTION OF PREFERRED EMBODIMENTS

Figure 1:
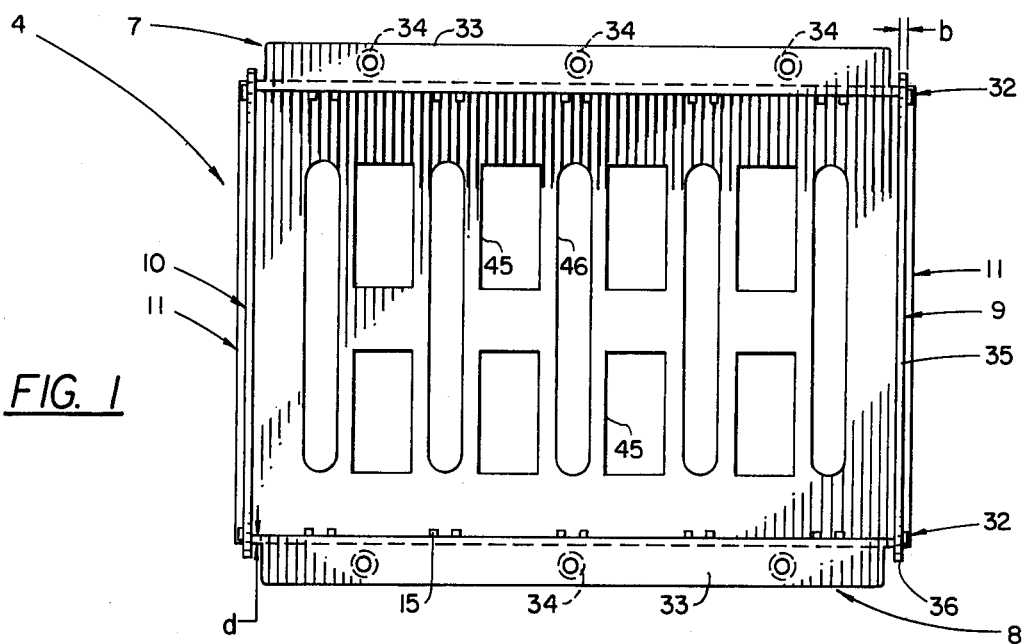
FIG. 1 is a front view of a chassis or shelf 4 embodying this invention.
Figure 2:
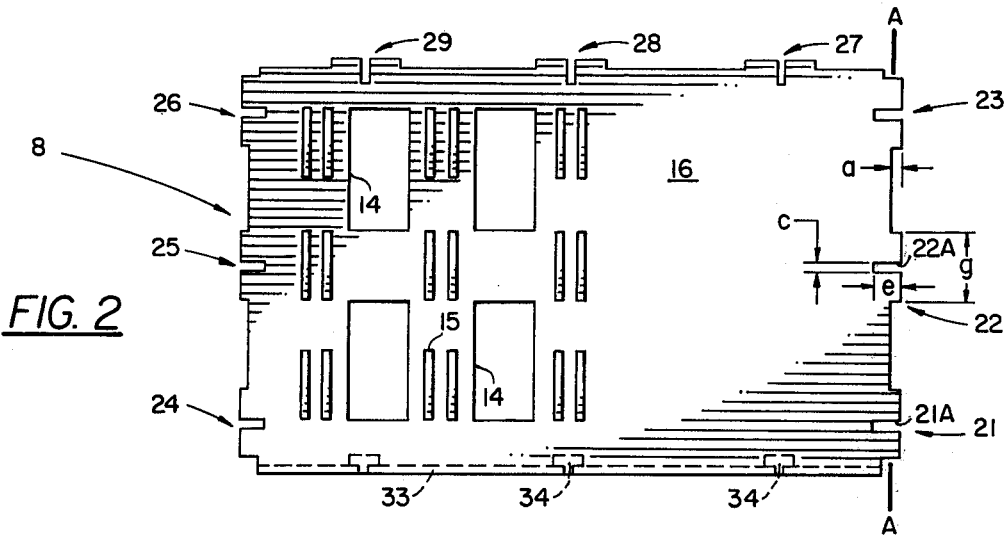
FIG. 2 is a top-plan view of the bottom 8 of the shelf 4 in FIG. 1.
Figure 3:
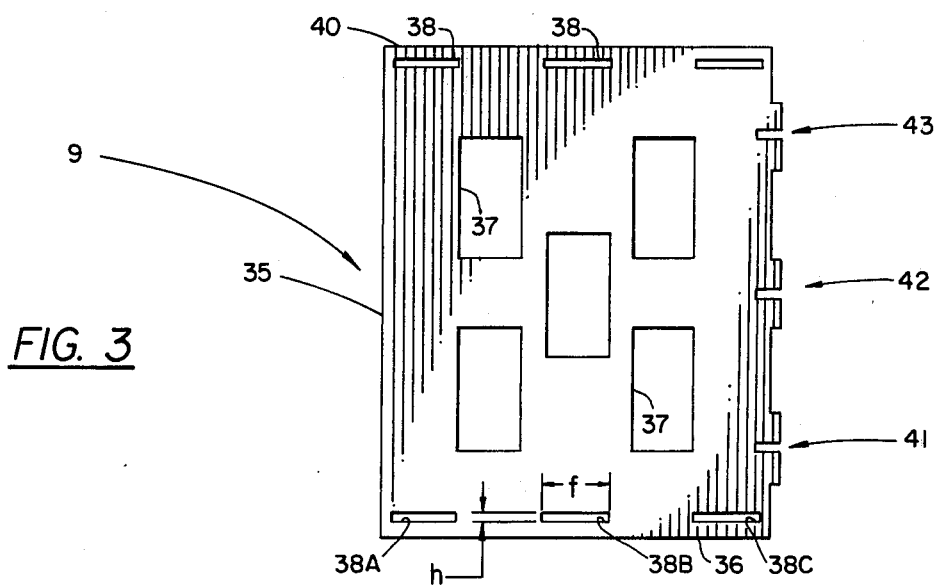
FIG. 3 is a plan view of the side 9 of the shelf 4 in FIG. 1.

The shelf 4 embodying this invention in FIGS. 1–3 comprises top and bottom parts 7 and 8, side parts 9 and 10, and a back part 11 which are all preferably made of sheet stock such as aluminum of the same thickness. The top and bottom parts 7 and 8 are preferably identical, as are the sides 9 and 10. Since these parts 7 and 8 are the same, only the bottom 8 will be described in detail. The bottom 8 has a plurality of holes 14 and a plurality of elongated flanges 15 which are raised up from the same flat surface 16 of the bottom. The flanges 15 are arranged in pairs of rows thereof which are parallel to each other and which are oriented so that corresponding rows in the top and bottom face each other in the same plane which is parallel to the sides 9 and 10 in the completed shelf 4. The rows of each pair of rows are spaced apart so as to receive a printed circuit card (not shown) there-between. The holes 14 provide openings for the passage of air which is required for cooling of electrical circuit elements on the cards.

A plurality of bifurcated tongues 21–29 are formed in the side edges and the rear edge of the bottom 8. All of the tongues on the various shelf parts are preferably identical. The tongue 22, for example, extends a distance a beyond the edge surface defined by line A—A. This distance a is substantially equal to the thickness b of the side 9 (see FIG. 1). The width c of the bifurcation-opening 22A in tongue 22 is preferably equal to the thickness d of the bottom 8 (see FIG. 1) so that this bifurcation-opening 22A has a square cross section (see FIG. 5). The depth e of the bifurcation-opening 22A is greater than the length of the screw 32 that is to be threaded into it (see FIGS. 4 and 6), and is preferably several times the thickness b of side 9.

In order to provide additional strength to the bottom 8, the front edge 33 is bent over at 90° with respect to the flat portion 16 thereof. Threaded plugs 34 may be pressed into holes in the front edge 33 to facilitate attachment of the shelf 4 to a rack (not shown).

The right side 9 of the shelf 4 is shown in the plan view of FIG. 3, the bottom edge 36 there corresponding to the bottom edge 36 of that side 9 in FIG. 1. A plurality of air holes 37 are formed in the central part of side 9. Rows of axially aligned slots 38 are also formed in the side 9 adjacent to and parallel to the top edge 40 and bottom edge 36 thereof. All of the slots are identical. The length f of slot 38B is only slightly greater than the length g of tongue 22 so that the latter fits snugly into this associated one of the slots. The width h of slot 38B is also only slightly greater than the thickness d of the tongue 22 and the bottom 8 (see FIG. 1) for the same reason. Three bifurcated tongues 41–43, which are similar to those in the bottom 8, are also formed in the back edge of side 9. The left side 10 of the shelf is identical to the right side 9.

The back 11 of the shelf has pluralities of air holes 45 and elongated openings 46 formed in it. The back also has slots (not shown) that are similar to the ones 38 in the side 9 in FIG. 3. These slots in the back are oriented in rows that are parallel to and are adjacent to the top edge, the bottom edge and the side edges thereof. These slots in the back 11 are oriented for aligning with corresponding ones of the tongues 27–29 and 41–43 at the back edges of the top and bottom and the sides in an assembled shelf. The elongated openings 46 in the back are aligned with associated pairs of flanges 15 in the top and bottom for receiving connectors (not shown) therein which in turn receive pins on the PC cards (also not shown).

The shelf 4 is assembled by aligning side tongues 21–26 on the bottom and top plates with associated slots 38 in the side plates (see FIG. 4) and inserting the former into the latter (see FIG. 5). These operations are illustrated in the perspective view of portions of the bottom plate 8 and the side 9 in FIG. 4 and the side view thereof in FIG. 5. The central opening 47 formed by the walls of the bifurcation-opening 21A and slot 38A in the engaged position in FIG. 5 is essentially square. The major diameter of the screw 32 which is to be threaded into this opening 47 is greater than the cross-section dimensions thereof so that the screw cuts threads in all four of the walls defining this opening 47. Also, the root diameter of screw 32 is only slightly greater than the cross-sectional dimensions of this central opening 47 to insure that the screw will be threaded into the opening 21A. This means that there is essentially a self-jigging of the screw 32 in the opening 47 such that it is initially guided into this opening 47. A screw 32 is threaded fully into each of the side openings 21A–26A to securely hold the side plates and the top and bottom plates together with the heads of the screws extending over the longitudinal edges of the slots 38 (see FIG. 6) and screw threads engaging walls of the plates over the full grip length of the screws. The back plate 11 is attached to the other plates 7–10 in a similar manner.

In a shelf embodying this invention that was similar to the one illustrated in FIGS. 1–6 and which was built and successfully operated, the plates 7–11 were each stamped in a single operation from 0.080 inch thick sheet stock which was number 5052 aluminum. The bifurcation-openings such as the one 21A in these plates measured 0.093 by 0.380 inches. The length of the tongue was 0.097 inch. The slots measured 0.093 by 1.0 inches. The screws 32 holding the plates of this shelf together were four 24 by 5/16 inch self-tapping or threading screws having a root diameter of 0.086 inch and a thread diameter of 0.110 inch. These screws were in contact with the walls of a plate defining a bifurcation-opening over the full grip length of the screws threads and exhibited very little misalignment in this opening. This shelf performed satisfactorily under vibration tests and several cycles of assembly and disassembly.

In the alternate embodiment of this invention in FIG. 7, the length $m$ of tongue 51 is less than the length $n$ of slot 52 to facilitate location of the tongue 51 in the latter. Posts 53 and 54, which are located on either side of the tongue 51, mate with similarly shaped holes 55 and 56 which are stamped in plate 57 to fix the position of the plates 57 and 58 with respect to each other. These two plates 57 and 58 are held together by screws 59 in the manner that was described above.

Although this invention is described in relation to preferred embodiments thereof, variations and modifications will occur to those skilled in the art without departing from the spirit of this invention. For example, bifurcation-openings in associated slots could be tapped so that conventional (non-tapping) screws could be used to hold parts together. Also, the openings such as 21A may be formed directly in the edge of plate 8 rather than in associated tongues, and slots may extend through an edge of a plate. It is also possible to use screws that do not have heads thereon. The scope of this invention is therefore to be defined by the attached claims rather than the aforementioned detailed description.

What is claimed is:

1. Apparatus comprising:

first and second plates;

said first plate having a first elongated opening in one edge thereof; said first opening extending through said one edge and at least one of the adjacent opposite sides of said first plate, the width of said first opening being substantially equal to the thickness of said first plate, the length of said first opening extending into said first plate being greater than the thickness of said second plate;

said second plate having a second elongated opening in it; said second opening extending through opposite sides of said second plate, having a width substantially equal to the thickness of said first plate, and having a length that is greater than the width of said first opening;

a portion of said first plate and said one edge thereof including said first opening fitting securely into said second opening in said second plate so that opposing surfaces of said plates which form said first and second openings together define a third opening having a substantially square cross-section; and a screw threaded into said third and first openings in the direction of the length of the latter — first opening for holding said first and second plates together, wherein said first plate has a first protrusion extending from an edge surface thereof with the first protrusion and first plate being in a common plane, said one edge containing the first opening being the exterior edge of said first protrusion and being spaced from said edge surface a distance which is substantially equal to the thickness of said second plate, said first protrusion being located in said second opening.

2. Apparatus according to claim 1 wherein said one edge of said first plate is adjacent and generally flush with one side of said second plate, the other side of said second plate opposite said one side thereof being located over said first plate.

3. Apparatus according to claim 2 wherein said second opening is formed in an edge thereof.

4. Apparatus according to claim 2 wherein said second opening is a slot through said second plate which is spaced from edges of the latter.

5. Apparatus according to claim 4 wherein the length of said slot is substantially equal to the length of said first protrusion so that the latter fits snugly into the former.

6. Apparatus according to claim 5 wherein said screw has self-tapping threads cutting threads in plate surfaces defining said slot and first opening.

7. Apparatus according to claim 5 wherein said screw has a head which is threaded adjacent to said one side of said second plate and said one edge.

8. Apparatus according to claim 7 wherein said plates are made of sheet metal.

9. A chassis comprising:
a first relatively rigid plate having a bifurcated tongue on a first edge thereof with said first plate and tongue being in a common plane, said tongue having a first elongated opening in one edge thereof which extends through said one edge and adjacent opposite sides of said tongue and first plate; said first opening having a width that is substantially equal to the thickness of said first plate and a length extending a prescribed distance into said first plate from said one edge;
a second relatively rigid plate having an elongated slot formed therein which extends through opposite sides thereof; said slot being spaced from edges of said second plate, having a length which is greater than the length of said tongue, and having a width which is only slightly greater than the thickness of said first plate and said tongue; said plates being oriented at approximately right angles with said tongue being located in said slot; and
a screw which is threaded into the second opening formed by adjacent surfaces which also define said slot and said first opening and into said first opening in the direction of the length of the first opening for holding said plates together.

10. The chassis according to claim 9 wherein said one edge is spaced from said first edge a distance that is substantially equal to the thickness of said second plate such that said one edge of said first plate is adjacent one side of said second plate, the other side of said second plate opposite said one side thereof being located adjacent said first edge.

11. The chassis according to claim 10 wherein the length of said slot is only slightly greater than the length of said tongue so that the latter fits snugly into the former.

12. The chassis according to claim 11 wherein said screw has self-tapping threads which cut threads in plate surfaces defining said slot and said first opening.

13. The chassis according to claim 12 wherein said screw has a head on it which is threaded adjacent said one side of said second plate and said one edge of said first plate.

14. The chassis according to claim 13 wherein said plates are made of sheet metal.

15. The chassis according to claim 10 including a post on said first edge of said first plate and being spaced from said tongue; said second plate having a second opening formed therein; said second opening being spaced from said slot and being positioned, sized and shaped for receiving said post snugly therein when said tongue is located in said slot.

16. A rectangularly shaped chassis comprising:
a pair of relatively flat side plates which are spaced apart in a parallel relationship;
a relatively flat top plate;
a relatively flat bottom plate;
said top and bottom plates being located between said side plates, and being spaced apart in a parallel relationship;
a relatively flat back plate being located at the rear of said other plates;
at least some one of said plates having bifurcated tongues on at least some edges thereof, said tongues having first elongated openings in one edges thereof which extend through said one edges and adjacent opposite sides of said tongues and plates; said first openings having widths that are substantially equal to the thicknesses of said tongues and having depths extending a prescribed distance into said plates with tongues from said one edges;
at least some other of said plates having elongated slots formed therein which extend through opposite side surfaces thereof; said slots being spaced from edges of associated plates, having lengths which are greater than the lengths of associated ones of said tongues, and having widths which are only slightly greater than the thicknesses of associated ones of said tongues;
said plates being arranged for being secured together at approximately right angles to an adjacent plate with a tongue on one of said plates being located in an associated slot in an other plate;
a plurality of screws, having lengths which are greater than the thickness of plates with slots and less than the prescribed distance, each screw being threaded into the central opening formed by adjacent surfaces defining a slot and the first opening in an associated tongue for holding said plates together.

17. The chassis according to claim 16 wherein said one edges are spaced from said some edges a distance that is substantially equal to the thicknesses of said plates containing said slots such that said one edges are adjacent one side surfaces of plates containing associated slots, the other — opposite side surfaces of the plates with slots being located against associated some edges.

18. The chassis according to claim 17 wherein said screws have self-tapping threads which cut threads in plate surfaces defining associated slots and first openings.

* * * * *